United States Patent
Bertness et al.

(10) Patent No.: US 6,919,725 B2
(45) Date of Patent: Jul. 19, 2005

(54) ELECTRONIC BATTERY TESTER/ CHARGER WITH INTEGRATED BATTERY CELL TEMPERATURE MEASUREMENT DEVICE

(75) Inventors: Kevin I. Bertness, Batavia, IL (US); J. David Vonderhaar, Bolingbrook, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/678,629

(22) Filed: Oct. 3, 2003

(65) Prior Publication Data

US 2005/0073314 A1 Apr. 7, 2005

(51) Int. Cl.⁷ ............................................. G01N 27/416
(52) U.S. Cl. ...................... 324/433; 324/431; 320/150
(58) Field of Search ................................ 324/430–434; 320/120, 132, 134, 144, 150, 153; 702/63

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |

(Continued)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |

(Continued)

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining the End of Battery Life", by S. DeBardelaben, *IEEE*, 1986, pp. 365–368, no month available.

"A Look at the Impedance of a Cell", by S. Debardelaben, *IEEE*, 1988, pp. 394–397, no month available.

(Continued)

*Primary Examiner*—Vincent Q. Nguyen
(74) *Attorney, Agent, or Firm*—Westman, Champlin & Kelly

(57) ABSTRACT

An electronic battery tester for testing a storage battery that includes a battery housing with a plurality of electrochemical cells electrically connected to terminals of the battery is provided. The battery tester includes positive and negative connectors that can connect to the battery terminals. The tester also includes a temperature sensor that can measure a temperature of an individual electrochemical cell of the plurality of electrochemical cells. Processing circuitry, which is coupled to the temperature sensor, is configured to test the battery using the positive and negative connectors and to provide an output related to the temperature measured by the temperature sensor. The present invention also provides a battery charger with an integrated battery cell temperature sensor.

31 Claims, 4 Drawing Sheets

U.S. PATENT DOCUMENTS

| | | | |
|---|---|---|---|
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,385,269 A | 5/1983 | Aspinwall et al. | 320/14 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,564,798 A | 1/1986 | Young | 320/6 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Kuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,541,489 A | 7/1996 | Dunstan | 320/2 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |

| | | | |
|---|---|---|---|
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,061,638 A | 5/2000 | Joyce | 702/63 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,586,941 B2 | 7/2003 | Bertness et al. | 324/426 |
| 6,597,150 B1 | 7/2003 | Bertness et al. | 320/104 |
| 2002/0171428 A1 | 11/2002 | Bertness | 324/426 |

FOREIGN PATENT DOCUMENTS

| | | |
|---|---|---|
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |

| | | |
|---|---|---|
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/04910 | 2/1998 |
| WO | WO 98/58270 | 12/1998 |
| WO | WO 99/23738 | 5/1999 |
| WO | WO 00/62049 | 10/2000 |
| WO | WO 00/67359 | 11/2000 |
| WO | WO 01/51947 | 7/2001 |

OTHER PUBLICATIONS

"The Impedance of Electrical Storage Cells", by N.A. Hampson et al., *Journal of Applied Electrochemistry*, 1980, pp. 3–11, no month available.

"A Package for Impedance/Admittance Data Analysis", by B. Boukamp, *Solid State Ionics*, 1986, pp. 136–140, no month available.

"Precision of Impedance Spectroscopy Estimates of Bulk, Reaction Rate, and Diffusion Parameters", by J. Macdonald et al., *J. Electroanal, Chem.*, 1991, pp. 1–11, no month available.

National Semiconductor Corporation, "High Q Notch Filter", Mar. 1969, Linear Brief 5, Mar. 1969.

Burr–Brown Corporation, "Design A 60 Hz Notch Filter with the UAF42", Jan. 1994, AB–071, 1994.

National Semiconductor Corporation, "LMF90–4$^{th}$–Order Elliptic Notch Filter", Dec. 1994, RRD–B30M115, Dec. 1994.

"Alligator Clips with Wire Penetrators" *J.S. Popper, Inc.* product information, downloaded from http://www.jspopper.com/, undated, date not available.

"#12: LM78S40 Simple Switcher DC to DC Converter", *ITM e–Catalog*, downloaded from http://www.pcbcafe.com, undated, date not available.

"Simple DC–DC Converts Allows Use of Single Battery", *Electronix Express*, downloaded from http://www.elexp.com/t_dc–dc.htm, undated, date not available.

"DC–DC Converter Basics", *Power Designers*, downloaded from http://www.powederdesigners.com/InforWeb.design$_{13}$ center/articles/DC–DC/converter.shtm, undated date not available.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

"JIS Japanese Industrial Standard–Lead Acid Batteries for Automobiles", *Japanese Standards Association UDC*, 621.355.2:629.113.006, Nov. 1995.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131, no month available.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e–Catalog*, downloaded from http://www.pcbcafe.com, prior to Oct. 1, 2002.

"Simple DC–DC Converts Allows Use of Single Battery", *Electronix Express*, downloaded from http://www.elexp.com/t_dc–dc.htm, prior to Oct. 1, 2002.

"DC–DC Converter Basics", *Power Designers*, downloaded from http://www.powederdesigners.com/InforWeb.design_center/articles/DC–DC/converter.shtm, prior to Oct. 1, 2002.

"Notification of Transmittal of The International Search Report or the Declaration", PCT/US02/29461, dated Jan., 2003.

"Notification of Transmittal of The International Search Report or the Declaration", PCT/US03/07546, dated Jul., 2003.

"Notification of Transmittal of The International Search Report or the Declaration", PCT/US03/06577, dated Jul., 2003.

ELECTRONIC BATTERY TESTER/CHARGER WITH INTEGRATED BATTERY CELL TEMPERATURE MEASUREMENT DEVICE

BACKGROUND OF THE INVENTION

The present invention relates to storage batteries. More specifically, the present invention relates to a battery tester/charger with an integrated battery cell temperature sensing device.

Storage batteries, such as lead acid storage batteries, are used in a variety of applications such as automotive vehicles and stand by power sources. Typically storage batteries consist of a plurality of individual storage cells which are electrically connected in series. Each cell can have a voltage potential of about 2.1 volts, for example. By connecting the cells in series, the voltages of individual cells are added in a cumulative manner. For example, in a typical automotive battery, six storage cells are used to provide a total voltage of 12.6 volts. The individual cells are held in a housing and the entire assembly is commonly referred to as the "battery".

It is frequently desirable to ascertain the condition of a storage battery. Various testing techniques have been developed over the long history of storage batteries. For example, one technique involves the use of a hygrometer in which the specific gravity of the acid mixture in the battery is measured. Electrical testing has also been used to provide less invasive battery testing techniques. A very simple electrical test is to simply measure the voltage across the battery. If the voltage is below a certain threshold, the battery is determined to be bad. Another technique for testing a battery is referred to as a load test. In the load test, the battery is discharged using a known load. As the battery is discharged, the voltage across the battery is monitored and used to determine the condition of the battery. More recently, a technique has been pioneered by Dr. Keith S. Champlin and Midtronics, Inc. of Willowbrook, Ill. for testing storage batteries by measuring a dynamic parameter of the battery such as the dynamic conductance of the battery. This technique is described in a number of United States patents and United States patent applications, for example U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul.

10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Ser. No. 09/703,270, filed Oct. 31, 2000, entitled ELECTRONIC BATTERY TESTER; U.S. Ser. No. 09/780, 146,filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483, 623, filed Jan. 13, 2000, entitled ALTERNATOR TESTER; U.S. Ser. No. 09/960,117, filed Sep. 20, 2001, entitled IN-VEHICLE BATTERY MONITOR; U.S. Ser. No. 09/908, 389, filed Jul. 18, 2001, entitled BATTERY CLAMP WITH INTEGRATED CIRCUIT SENSOR; U.S. Ser. No. 09/908, 278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 09/977,049, filed Oct. 12, 2001, entitled PROGRAMMABLE CURRENT EXCITER FOR MEASURING AC IMMITTANCE OF CELLS AND BATTERIES; U.S. Ser. No. 60/330,441, filed Oct. 17, 2001, entitled ELECTRONIC BATTERY TESTER WITH RELATIVE TEST OUTPUT; U.S. Ser. No. 60/348, 479, filed Oct. 29, 2001, entitled CONCEPT FOR TESTING HIGH POWER VRLA BATTERIES; U.S. Ser. No. 10/046, 659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/ BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 60/379,281, filed May 8, 2002, entitled METHOD FOR DETERMINING BATTERY STATE OF CHARGE; U.S. Ser. No. 10/143,307, filed May 10, 2002, entitled ELECTRONIC BATTERY TESTER; U.S. Ser. No. 60/387,046, filed Jun. 7, 2002, entitled METHOD AND APPARATUS FOR INCREASING THE LIFE OF A STORAGE BATTERY; U.S. Ser. No. 10/177, 635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408, 542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT, which are incorporated herein in their entirety.

In general, most prior art battery testing/charging techniques have utilized either the battery's ambient temperature or its external case temperature for applying temperature corrections to measured test results and/or for controlling charging of the battery. However, the causes of, and problems resulting from, localized internal heating of the battery, which can hinder proper charging and/or testing of the battery, are not addressed in such prior art battery testing/charging techniques.

SUMMARY OF THE INVENTION

An electronic battery tester for testing a storage battery that includes a battery housing with a plurality of electrochemical cells electrically connected to terminals of the battery is provided. The battery tester includes positive and negative connectors that can connect to the battery terminals. The tester also includes a temperature sensor that can measure a temperature of an individual electrochemical cell of the plurality of electrochemical cells. Processing circuitry, which is coupled to the temperature sensor, is configured to test the battery using the positive and negative connectors and to provide an output related to the temperature measured by the temperature sensor.

Another aspect of the invention includes a battery charger with an integrated battery cell temperature sensor.

BRIEF DESCRIPTION OF THE DRAWINGS

FIG. 2-1 is a simplified block diagram of a battery charger/tester with an integrated battery cell temperature sensor in accordance with an embodiment of the present invention.

FIG. 2-2 is a plot showing an example battery cell-temperature curve for a 6-cell battery.

DETAILED DESCRIPTION OF THE PREFERRED EMBODIMENTS

The present invention provides a battery tester/charger with an integrated temperature sensor that is capable of measuring battery cell temperature. The tester/charger is configured to test/charge the battery and to provide an output related to the temperature measured by the temperature sensor.

Figure 1:
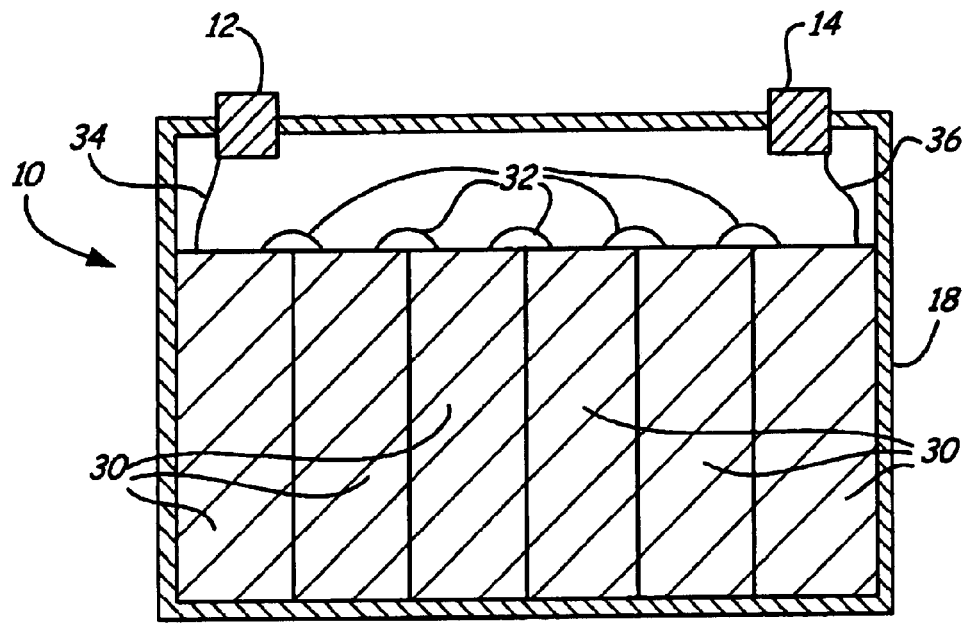
FIG. 1 is a side cross-sectional view of a storage battery which can be tested/charged using a battery tester/charger of the present invention.

FIG. 1 is a side cross-sectional view of a storage battery 10 which can be tested/charged using a battery tester/charger of the present invention. As illustrated in FIG. 1, battery 10 is a storage battery such as a lead-acid battery and includes a number of electrochemical cells in a battery housing 18 which are electrically connected in series by conductors 32. This forms a string of cells 30 having one end electrically coupled to a positive terminal 12 through conductor 34 and having the other end electrically coupled to a negative terminal 14 through conductor 36. Each cell 30 includes chemically active positive and negative plates that are insulated from each other by suitable separators and are submerged in an electrolyte. Chemical reactions between the electrolyte and the plates result in the production of electricity in lead-acid battery cells, charged negative plates contain spongy (porous) lead (Pb) and charged positive plates contain lead peroxide ($PbO_2$). These substances are known as active materials of the plates. During the life of the battery, flakes of active material that drop off the plates of a cell can accumulate at the bottom of the case of a cell and cause a short circuit between the plates. Also, electrical connections 32 between two adjacent cells may deteriorate causing an open circuit condition between two cells. Such short circuit conditions within a cell, open circuit conditions between adjacent cells and other aberrations such as depletion of the electrolyte can result in localized (restricted to a cell or a pair of adjacent cells) temperature changes within the battery. Therefore, obtaining individual battery cell temperature measurements and comparing these quantities with a nominal battery cell temperature (a temperature of a chosen pilot cell of the different battery cells (such as 30), for example) is desirable during battery testing/charging for providing a tester/charger user additional information on the condition of the battery.

Figures 1, 2:
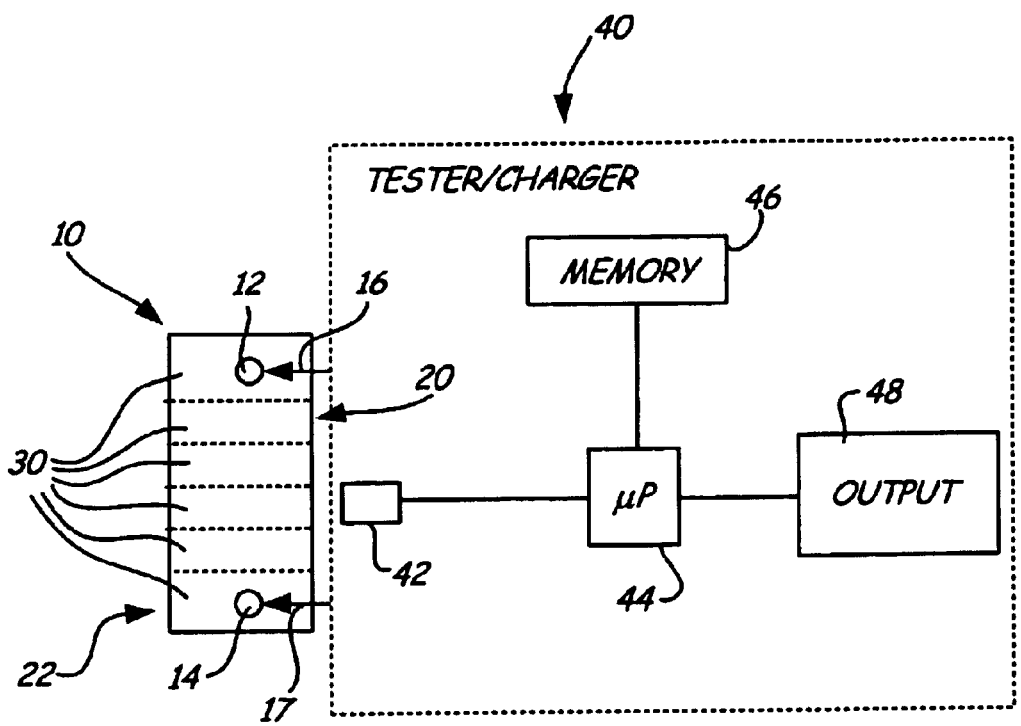
Figure 2:
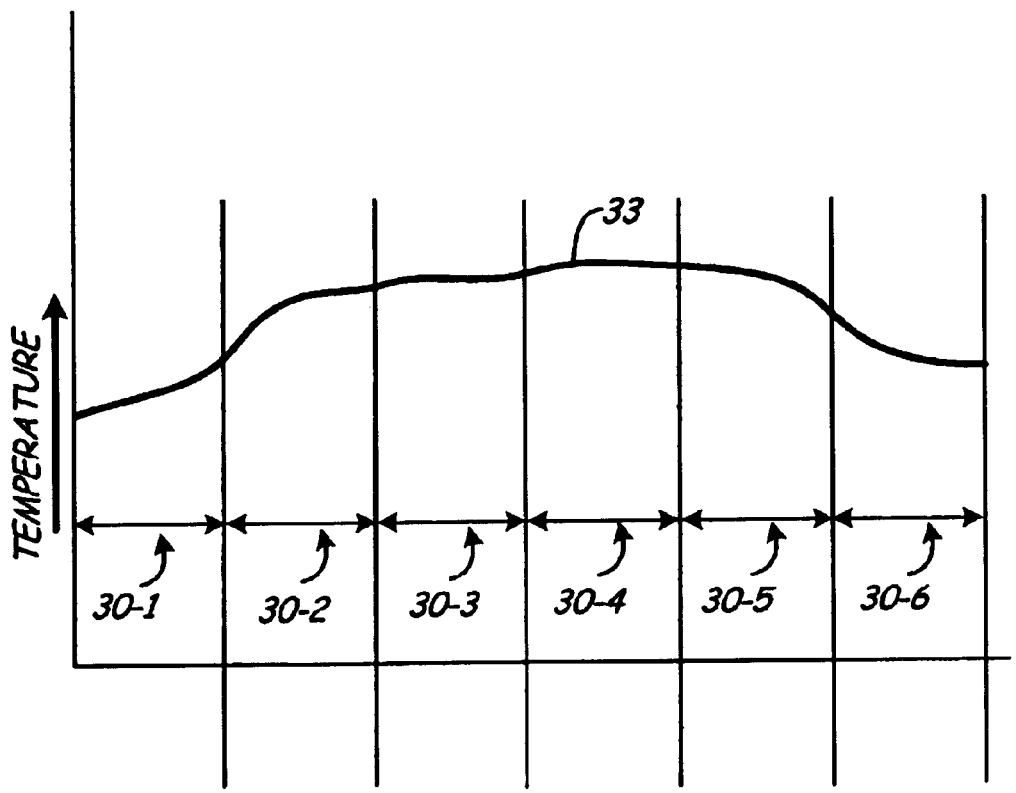

FIG. 2-1 is a simplified block diagram of a battery charger/tester 40 with an integrated battery cell temperature sensor in accordance with an embodiment of the present invention. Circuitry of charger/tester 40 couples to terminals 12 and 14 of battery 10 through positive connector 16 and negative connector 17. Battery charger/tester 40 includes temperature sensor 42, a microprocessor or processing circuitry 44, a memory 46 and an output 48. Temperature sensor 42, which is capable of measuring battery cell temperature is coupled to microprocessor 44 and provides the battery cell temperature measurements to microprocessor 44. Microprocessor 44 is also coupled to memory 46 and output 48. In various aspects of the present invention, measured battery cell temperature is displayed to the tester/charger user via output 48, used to detect open circuit conditions within battery 10 and/or used to detect short circuit conditions within battery 10. Details regarding detecting open circuit conditions and/or short circuit conditions within battery 10 are provided further below.

In some embodiments of the present invention, the temperature sensor is a non-contact sensor which is capable of measuring the temperature of a particular cell when positioned proximate the particular cell of cells 30 as shown in FIG. 2-1. One example of a non-contact sensor which is suitable for use with the present invention is an infrared (IR) temperature sensor. Cell temperature measurements are carried out by positioning the IR sensor proximate a side 20, 22 of battery 10 and aiming or directing a laser beam from the IR sensor at different points on the surface of battery housing 18 along side 20, 22 of battery 10. At each different point, IR radiation that is emitted from the target (or point on the surface of battery 10) is focused onto an IR detector of the sensor, which determines the temperature of the target as a function of the radiation emitted from the target.

Examples of, and details regarding, IR temperature sensors suitable for use with the present invention are set forth in U.S. Pat. No. 6,290,389, entitled "DEVICE FOR TEMPERATURE MEASUREMENT," U.S. Pat. No. 6,234,669, entitled "DEVICE FOR MEASURING TEMPERATURE WITHOUT CONTACT" and U.S. Pat. No. 4,634,294, entitled "HAND-HELD DIGITAL TEMPERATURE MEA- SURING INSTRUMENT," which are incorporated herein by reference in their entirety.

In some embodiments of the present invention, temperature sensor 42 is a contact-type temperature sensor which is brought in contact with different points on the surface of battery housing 18 along side 20, 22 of battery 10. Temperature measurements are obtained by the contact-type sensor at each of these different points. Contact-type temperature sensors suitable for use with the present invention include thermistors, resistance temperature detectors (RTDs), thermocouples and solid-state sensors. In embodiments of the present invention, these contact-type temperature sensors are protected with non-corrosive materials such as plastic, encapsulant, stainless steel, etc.

In general, any temperature sensor which provides accurate temperature measurements of small target areas without including unwanted background temperatures is suitable for use with battery charger/tester 40 of the present invention.

As mentioned above, temperature sensor 42 is coupled to microprocessor 44 using a suitable interface via which temperature measurements are provided to microprocessor 44. In some embodiments of the present invention, microprocessor 44 is configured to provide the temperature measurements that it receives from sensor 42 to the tester user via output 48. In other embodiments, microprocessor 44 stores the temperature measurements in memory 46. These measurements are displayed on output 48 upon entry of a request by the tester user via an input (such as 76, shown in FIG. 3), which is coupled to microprocessor 44.

FIG. 2—2 is an example battery cell-temperature curve 33 for a 6-cell battery, wherein each of the 6 cells (30-1 through 30-6) is a "good" cell (or cell having none of the above-mentioned aberrations). As can be seen in FIG. 2—2, the temperature of outer cells 30-1 and 30-6, which can relatively easily dissipate heat, is lower than the temperature of inner cells 30-2 through 30-5. As mentioned above, short circuit conditions within a cell, open circuit conditions between adjacent cells and other aberrations such as depletion of the electrolyte can result in localized (restricted to a cell or a pair of adjacent cells) temperature changes within the battery. These localized temperature changes are propagated to portions of battery housing 18 adjacent the cell(s). Thus, when temperature measurements of each cell of cells 30 are carried out in turn using temperature sensor 42, coupled to microprocessor 44, and substantial deviations or variations are present in the temperature readings, one or more of the above-mentioned conditions (aberrations) exist within battery 10. In embodiments of the present invention, microprocessor 44 is configured to carry out such comparisons between the different temperature measurements and accordingly indicate to the tester user, via output 48, the presence or absence of one or more such aberrations within battery 10.

In some embodiments of the present invention, microprocessor 44 compares each of the temperature measurements with one or more predetermined temperature thresholds, and based on these comparisons, indicates whether an open circuit condition, short circuit condition, etc., is present within battery 10. For example, if a certain cell temperature measurement is below a first threshold, microprocessor 44 reports, via output 48, that an open circuit condition is present within battery 10. Similarly, if a certain cell temperature measurement is above a second threshold, microprocessor 44 reports that a short circuit condition is present within battery 10.

It should be noted that the nominal temperature and the threshold temperature(s) can vary widely with ambient conditions. One way for obtaining the nominal temperature would be from a different temperature sensor already located proximate the battery. Here, the nominal temperature can be entered by the tester/charger user via input 72. Also, as mentioned above, a temperature of a chosen pilot cell of the different battery cells can be selected as the nominal temperature. Components of a battery tester with an integrated battery cell temperature sensor are described below in connection with FIG. 3.

Figure 3:
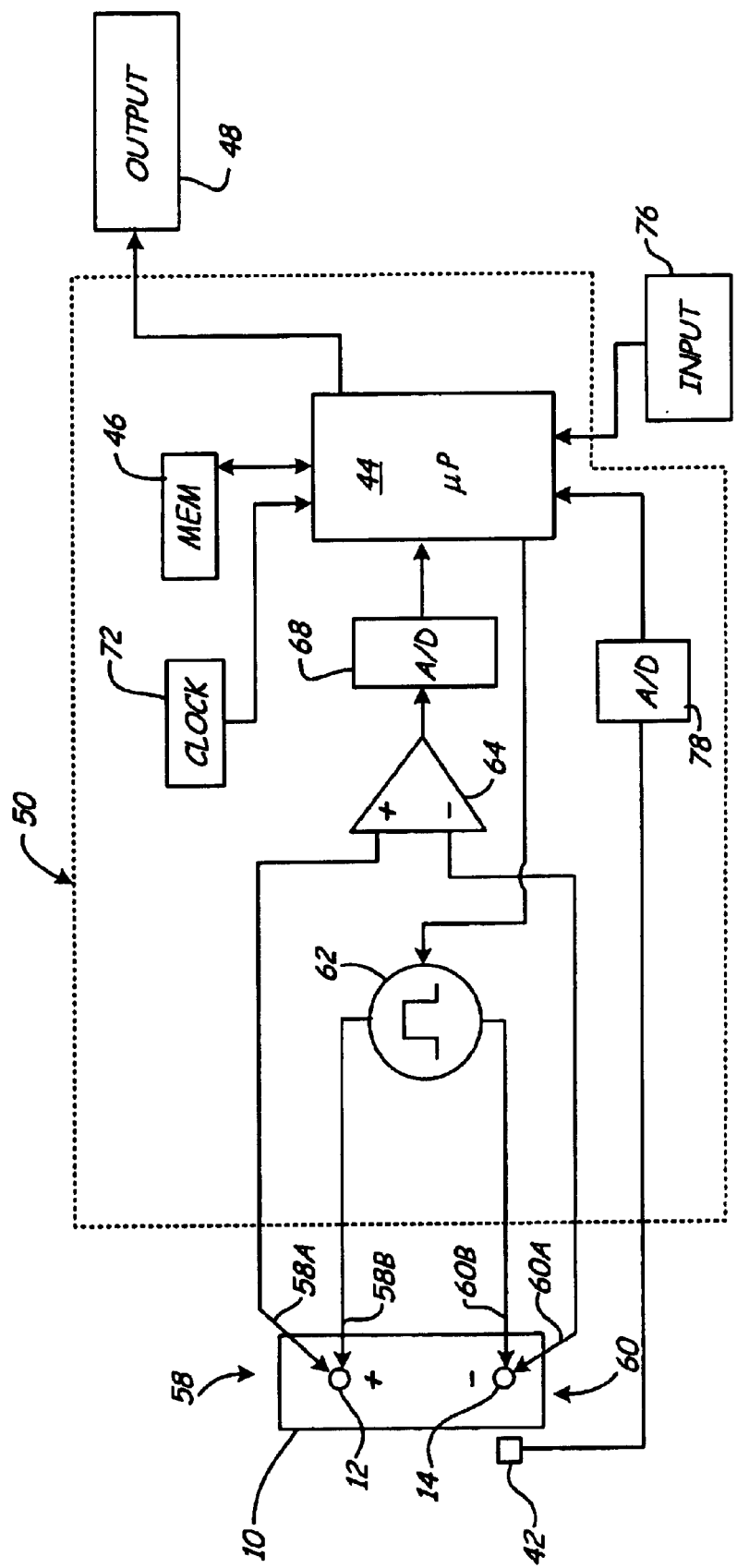
FIG. 3 is a simplified block diagram of a battery tester with an integrated battery cell temperature sensor in accordance with an embodiment of the present invention.

FIG. 3 is a simplified block diagram showing components of a battery tester with an integrated battery cell temperature sensor in accordance with an embodiment of the present invention. In this embodiment, instead of single connectors 16 and 17 (FIG. 2-1), a four point (or Kelvin connection) technique is used to couple battery tester 50 to battery 10. Kelvin connections 58 and 60 are used to couple to battery terminals 12 and 14, respectively, of battery 10. Kelvin connection 58 includes two individual connections 58A and 58B. Similarly, Kelvin connection 60 includes two individual connections, 60A and 60B.

Circuitry 50 includes a current source 62 and a differential amplifier 64. Current source 62 is coupled to connections 58B and 60B of Kelvin connections 58 and 60, respectively. Differential amplifier 64 is coupled to connection 58A and connection 60A of Kelvin connections 58 and 60, respectively. An output from differential amplifier 64 is provided to analog to digital converter 68 which itself provides a digitized output to microprocessor 44. Microprocessor 44 is connected to a system clock 72, a memory 46, and analog to digital converter 78. Microprocessor 44 is also capable of receiving an input from an input device 76 and providing an output to output device 48. The input can be, for example, a rating for the battery 10. Input device 76 can comprise any or multiple types of input devices. The result of a battery test, either qualitative or quantitative, can be an output on device 48. As mentioned above, device 48 can be a display or other output. The invention can operate with any technique for determining a voltage across battery 10 and a current through battery 10 and is not limited to the specific techniques set forth herein. The forcing function source or current source 62 can provide any signal having a time varying component, including a stepped pulse or a periodic signal, having any shape, applied to battery 10. The current source can be an active source in which the current source signal is injected into battery 10, or can be a passive source, such as a load, which is switched on under the control of microprocessor 44.

In operation, microprocessor 44 can receive an input through input 76, such as a rating for battery 10. Microprocessor 44 determines a dynamic parameter, such as dynamic conductance, of battery 10 as a function of sensed voltage and current. The change in these sensed values is used to determine the dynamic parameter. For example, the dynamic conductance ($\Delta G$) is determined as:

$$\Delta G = \Delta I / \Delta V \qquad \text{EQ. 1}$$

where $\Delta I$ is the change in current flowing through battery 10 due to current source 62 and $\Delta V$ is the change in battery voltage due to applied current $\Delta I$. Temperature sensor 42 can be thermally coupled to individual cells of battery 10 and operates in conjunction with microprocessor 44 as described-above in connection with FIG. 3. Temperature readings can be stored in memory 46 for later retrieval.

In embodiments of the present invention, apparatus 50 is of a size suitable for portable use. Such a portable tester can include a moveable contact/non-contact temperature sensor with which individual battery cell temperature measurements can easily be taken in turn.

Figure 4:
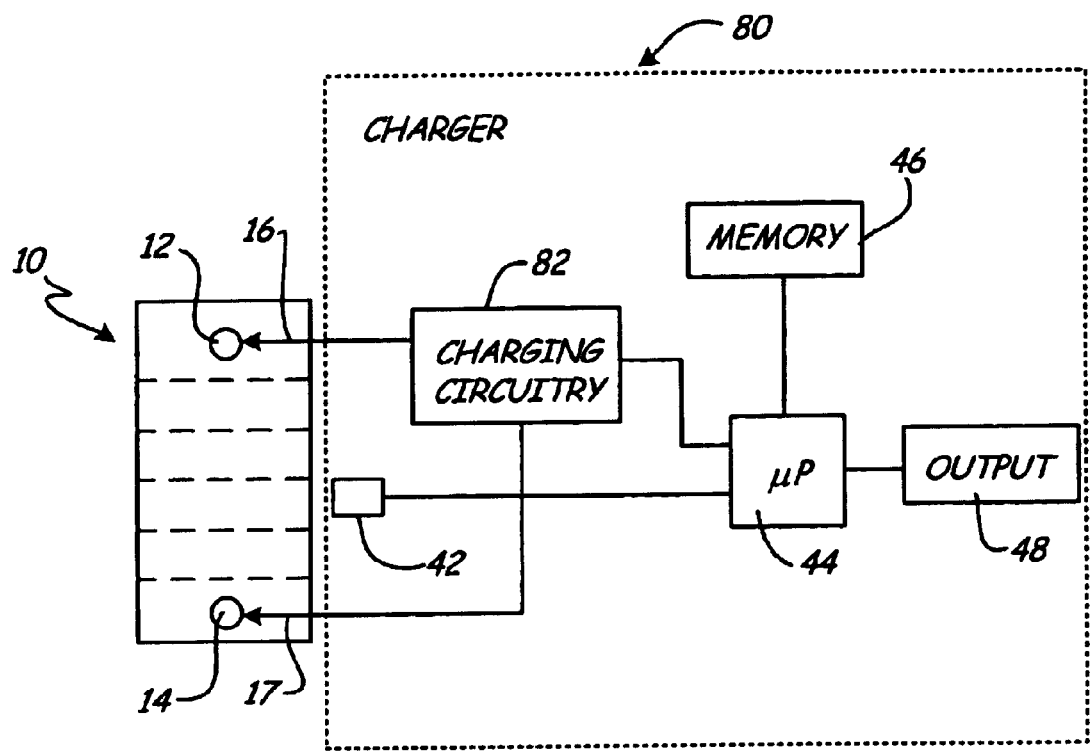
FIG. 4 is a simplified block diagram of a battery charger with an integrated battery cell temperature sensor in accordance with an embodiment of the present invention.

FIG. 4 is a simplified block diagram of a battery charger with an integrated battery cell temperature sensor in accordance with an embodiment of the present invention. Battery charger 80 includes charging circuitry 82, a microprocessor 44, a memory 46 and an output 48. Charger 80 couples to battery contacts 12 and 14 through connectors 16 and 17 respectively. Battery charger 80 operates in a manner similar to the battery charger set forth in U.S. Pat. No. 6,104,167, issued Aug. 15, 2000, and entitled "METHOD AND APPARATUS FOR CHARGING A BATTERY", which is incorporated herein by reference. Further, temperature sensor 42, which is included in battery charger 80, operates in conjunction with microprocessor 44 as described above in connection with FIG. 3.

Although the present invention has been described with reference to preferred embodiments, workers skilled in the art will recognize that changes may be made in form and detail without departing from the spirit and scope of the invention. In general, the invention is directed to a battery tester/charger with an integrated battery cell temperature sensor and is not restricted to the types of chargers/testers with integrated cell temperature sensors described in the illustrative embodiments. Thus, any type of temperature sensor (contact or non-contact), known in the industry or developed in future, which is capable of measuring battery cell temperature, can be employed, without departing from the scope and spirit of the present invention.

What is claimed is:

1. An electronic battery tester for testing a storage battery, the storage battery including a battery housing and a plurality of electrochemical cells in the battery housing electrically connected to a positive terminal of the battery and a negative terminal of the battery, the tester comprising:
   a positive connector coupled to the positive terminal of the battery;
   a negative connector coupled to the negative terminal of the battery;
   a temperature sensor configured to measure a temperature of an individual electrochemical cell of the plurality of electrochemical cells of the battery; and
   processing circuitry, coupled to the temperature sensor, configured to test the battery using the first and second connectors and to provide an output related to the temperature measured by the temperature sensor.

2. The electronic battery tester of claim 1 wherein the temperature sensor is a non-contact temperature sensor.

3. The electronic battery tester of claim 2 wherein the non-contact temperature sensor is an infrared temperature sensor.

4. The electronic battery tester of claim 1 wherein the processing circuitry is configured to provide a condition of the electrochemical cell of the plurality of electrochemical cells based on the temperature measured by the temperature sensor.

5. The electronic battery tester of claim 4 wherein the condition of the electrochemical cell of the plurality of electrochemical cells relates to the presence or absence of a short circuit condition in the electrochemical cell.

6. The electronic battery tester of claim 4 wherein the condition of the electrochemical cell of the plurality of electrochemical cells relates to the presence or absence of an open circuit condition in the electrochemical cell.

7. The electronic battery tester of claim 4 wherein the processing circuitry is configured to provide a condition of the electrochemical cell of the plurality of electrochemical cells based on the temperature measured by the temperature sensor by comparing the temperature measured by the temperature sensor with a predetermined threshold temperature.

8. The electronic battery tester of claim 7 wherein the predetermined threshold temperature is stored in a memory.

9. The electronic battery tester of claim 1 wherein the temperature sensor is a contact-type temperature sensor.

10. The electronic battery tester of claim 9 wherein the contact-type temperature sensor comprises a thermocouple.

11. The electronic battery tester of claim 9 wherein the contact-type temperature sensor comprises a resistance temperature detector (RTD) sensor.

12. The electronic battery tester of claim 9 wherein the contact-type temperature sensor comprises a solid-state sensor.

13. The electronic battery tester of claim 9 wherein the contact-type temperature sensor comprises a thermistor.

14. The electronic battery tester of claim 1 wherein the positive connector comprises a first Kelvin connection and the negative connector comprises a second Kelvin connection.

15. The electronic battery tester of claim 1 further comprising a battery charger.

16. An electronic battery charger for charging a storage battery, the storage battery including a battery housing and a plurality of electrochemical cells in the battery housing electrically connected to a positive terminal of the battery and a negative terminal of the battery, the charger comprising:
   a positive connector coupled to the positive terminal of the battery;
   a negative connector coupled to the negative terminal of the battery;
   a temperature sensor configured to measure a temperature of an individual electrochemical cell of the plurality of electrochemical cells of the battery; and
   processing circuitry, coupled to the temperature sensor, configured to charge the battery using the first and second Kelvin connectors and to provide an output related to the temperature measured by the temperature sensor.

17. The electronic battery charger of claim 16 wherein the temperature sensor is a non-contact temperature sensor.

18. The electronic battery charger of claim 17 wherein the non-contact temperature sensor is an infrared temperature sensor.

19. The electronic battery charger of claim 16 wherein the processing circuitry is configured to provide a condition of the electrochemical cell of the plurality of electrochemical cells based on the temperature measured by the temperature sensor.

20. The electronic battery charger of claim 19 wherein the condition of the electrochemical cell of the plurality of electrochemical cells relates to the presence or absence of a short circuit condition in the electrochemical cell.

21. The electronic battery charger of claim 19 wherein the condition of the electrochemical cell of the plurality of electrochemical cells relates to the presence or absence of an open circuit condition in the electrochemical cell.

22. The electronic battery charger of claim 19 wherein the processing circuitry is configured to provide a condition of the electrochemical cell of the plurality of electrochemical cells based on the temperature measured by the temperature sensor by comparing the temperature measured by the temperature sensor with a predetermined threshold temperature.

23. The electronic battery charger of claim 22 wherein the predetermined threshold temperature is stored in a memory.

24. The electronic battery charger of claim 16 wherein the temperature sensor is a contact-type temperature sensor.

25. The electronic battery charger of claim 24 wherein the contact-type temperature sensor comprises a thermocouple.

26. The electronic battery charger of claim 24 wherein the contact-type temperature sensor comprises a resistance temperature detector (RTD) sensor.

27. The electronic battery charger of claim 24 wherein the contact-type temperature sensor comprises a solid-state sensor.

28. The electronic battery charger of claim 24 wherein the contact-type temperature sensor comprises a thermistor.

29. An portable battery tester for testing a storage battery, the storage battery including a battery housing and a plurality of electrochemical cells in the battery housing electrically connected to a positive terminal of the battery and a negative terminal of the battery, the tester comprising:

a positive connector coupled to the positive terminal of the battery;

a negative connector coupled to the negative terminal of the battery;

a moveable temperature sensor configured to measure a temperature of an individual electrochemical cell of the plurality of electrochemical cells of the battery; and processing circuitry, coupled to the temperature sensor, configured to test the battery using the first and second connectors and to provide an output related to the temperature measured by the temperature sensor.

30. The portable battery tester of claim 29 wherein the moveable temperature sensor is a moveable non-contact temperature sensor.

31. The portable battery tester of claim 29 wherein the moveable temperature sensor is a moveable contact-type temperature sensor.

* * * * *